(12) United States Patent
Kim

(10) Patent No.: US 11,270,816 B2
(45) Date of Patent: Mar. 8, 2022

(54) DATA CABLE DEVICE HAVING CABLE BATTERY

(71) Applicant: LG Chem, Ltd., Seoul (KR)

(72) Inventor: Hee-Gyu Kim, Daejeon (KR)

(73) Assignee: LG Energy Solution, Ltd.

( * ) Notice: Subject to any disclaimer, the term of this patent is extended or adjusted under 35 U.S.C. 154(b) by 0 days.

(21) Appl. No.: 16/980,139

(22) PCT Filed: Jul. 8, 2019

(86) PCT No.: PCT/KR2019/008370
§ 371 (c)(1),
(2) Date: Sep. 11, 2020

(87) PCT Pub. No.: WO2020/013548
PCT Pub. Date: Jan. 16, 2020

(65) Prior Publication Data
US 2021/0005350 A1 Jan. 7, 2021

(30) Foreign Application Priority Data
Jul. 13, 2018 (KR) .................. 10-2018-0081894

(51) Int. Cl.
*H01B 11/00* (2006.01)
*H01M 50/116* (2021.01)
(Continued)

(52) U.S. Cl.
CPC .......... *H01B 11/00* (2013.01); *H01B 7/0216* (2013.01); *H01M 10/425* (2013.01);
(Continued)

(58) Field of Classification Search
CPC ....... H01B 11/00; H01B 7/04; H01M 10/425; H01M 2010/4271; H01M 2220/30;
(Continued)

(56) References Cited

U.S. PATENT DOCUMENTS

2010/0279158 A1* 11/2010 Kumakari ......... H01M 10/0431
429/94
2011/0052984 A1* 3/2011 Nakamura ............ H01M 4/131
429/213
(Continued)

FOREIGN PATENT DOCUMENTS

CN 104025338 A 9/2014
CN 204089266 U 1/2015
(Continued)

OTHER PUBLICATIONS

International Search Report for Application No. PCT/KR2019/008370 dated Oct. 28, 2019, 2 pages.
(Continued)

*Primary Examiner* — William H. Mayo, III
*Assistant Examiner* — Rhadames Alonzo Miller
(74) *Attorney, Agent, or Firm* — Lerner, David, Littenberg, Krumholz & Mentlik, LLP

(57) ABSTRACT

A data cable device includes USB connectors respectively formed at opposing ends of the data cable device; at least one data line having ends electrically connected to the respective USB connectors; a protection circuit module having a printed circuit board at which an external terminal is formed; a cable battery including an external input/output terminal electrically connected to an internal terminal of the printed circuit board, an inner electrode layer having a cylindrical shape formed at an inner center of the cable battery, a separator layer formed at an outer side of the inner electrode layer, an outer electrode layer formed at an outer side of the separator layer, and an inner insulation coating layer surrounding an outer surface of the outer electrode layer; and an outer insulation coating layer formed to surround at least a portion of an outer surface of the cable battery.

10 Claims, 6 Drawing Sheets

(51) Int. Cl.
  *H01M 50/213* (2021.01)
  *H01B 7/02* (2006.01)
  *H01M 10/42* (2006.01)
  *H01R 24/62* (2011.01)
  *H05K 1/02* (2006.01)
  *H04M 1/725* (2021.01)

(52) U.S. Cl.
  CPC ....... *H01M 50/116* (2021.01); *H01M 50/213* (2021.01); *H01R 24/62* (2013.01); *H05K 1/028* (2013.01); *H01M 2010/4271* (2013.01); *H01M 2220/30* (2013.01); *H04M 1/725* (2013.01); *H05K 2201/09027* (2013.01); *H05K 2201/10106* (2013.01)

(58) Field of Classification Search
  CPC ............. H01M 50/107; H01M 50/116; H01M 50/136; H01M 50/14; H01M 50/172; H01M 50/213; H01M 50/247; H01M 50/531; H01M 10/0587; H05K 1/028; H05K 1/147; H05K 2201/051
  See application file for complete search history.

(56) References Cited

U.S. PATENT DOCUMENTS

| | | | | |
|---|---|---|---|---|
| 2013/0312999 | A1* | 11/2013 | Lin | H05K 1/028 174/117 F |
| 2014/0170456 | A1* | 6/2014 | Kwon | H01M 4/13 429/94 |
| 2014/0199568 | A1* | 7/2014 | Kwon | H01M 10/0445 429/90 |
| 2014/0272506 | A1* | 9/2014 | Kwon | H01M 4/75 429/94 |
| 2014/0335391 | A1 | 11/2014 | Kwon et al. | |
| 2015/0304757 | A1* | 10/2015 | Kim | H02J 7/00 381/74 |
| 2015/0312666 | A1* | 10/2015 | Park | H04R 1/1041 381/74 |
| 2016/0208992 | A1* | 7/2016 | Parsons | F21V 23/06 |
| 2017/0110760 | A1* | 4/2017 | Hatta | H01M 50/44 |
| 2017/0207425 | A1* | 7/2017 | Chun | A45C 13/001 |
| 2017/0250448 | A1 | 8/2017 | Kwon et al. | |
| 2018/0166892 | A1* | 6/2018 | Sepe, Jr. | H02J 7/0091 |
| 2018/0287191 | A1* | 10/2018 | Uhm | G02B 6/443 |
| 2018/0374604 | A1 | 12/2018 | Yang et al. | |
| 2019/0058223 | A1* | 2/2019 | Uhm | H01M 4/75 |
| 2020/0212377 | A1* | 7/2020 | Nakamura | H01M 50/10 |

FOREIGN PATENT DOCUMENTS

| | | | |
|---|---|---|---|
| CN | 105226460 | A | 1/2016 |
| CN | 107196161 | A | 9/2017 |
| CN | 206806683 | U * | 12/2017 |
| CN | 108140902 | A | 6/2018 |
| EP | 2667691 | A2 | 11/2013 |
| EP | 2772980 | A1 | 9/2014 |
| JP | 2001110244 | A | 4/2001 |
| JP | 2006147410 | A | 6/2006 |
| JP | 2009140612 | A | 6/2009 |
| JP | 2015521363 | A | 7/2015 |
| JP | 2017537437 | A | 12/2017 |
| KR | 101285506 | B1 | 7/2013 |
| KR | 200470159 | Y1 | 12/2013 |
| KR | 20130006884 | U * | 12/2013 |
| KR | 20140088700 | A | 7/2014 |
| KR | 20140004995 | U | 9/2014 |
| KR | 20160007896 | A | 1/2016 |
| KR | 101720078 | B1 | 3/2017 |
| KR | 20170116376 | A | 10/2017 |
| KR | 20180017565 | A | 2/2018 |
| WO | 2016006755 | A1 | 1/2016 |

OTHER PUBLICATIONS

Search Report for Chinese Application No. 201980013423.8 dated Sep. 28, 2021. 2 pgs.
Extended European Search Report including Written Opinion for Application No. 19834045.7 dated May 3, 2021, 9 pages.

* cited by examiner

DATA CABLE DEVICE HAVING CABLE BATTERY

CROSS-REFERENCE TO RELATED APPLICATIONS

The present application is a national phase entry under 35 U.S.C. § 371 of International Application No. PCT/KR2019/008370, filed Jul. 8, 2019, which claims priority to Korean Patent Application No. 10-2018-0081894 filed on Jul. 13, 2018 in the Republic of Korea, the disclosures of which are incorporated herein by reference.

TECHNICAL FIELD

The present disclosure relates to a data cable device having a cable battery, and more particularly, to a data cable device that effectively improves the ease of use of an electronic device.

BACKGROUND ART

Generally, a portable electronic device such as a mobile phone, a smartphone, a tablet PC, a portable video player (PMP), and the like has a built-in battery for power supply and charges the battery using an external power source.

At this time, the battery may be supplied with a charging power using a charger. In addition, most chargers may rectify 110V/220V AC power into DC power, then drop the DC power to a predetermined voltage level suitable for charging by using a switching mode power supply (SMPS) and supply the dropped DC power.

In addition, recently, a data cable is used for data communication between such portable electronic devices or between a computer and an electronic device. In addition to the data communication, the data cable is also configured to play a role of charging a portable electronic device by coupling one side of the data cable to a charging device and connecting the other side of the data cable to the portable electronic device. Also, the data cable may also be used to charge a portable electronic device using a USB connector power source of a computer.

However, if a user is at a location where it is difficult to use a power outlet for receiving an external power or while the user is moving, it is impossible to charge a portable electronic device using a charger that requires an external power.

Accordingly, in the prior art, in order to easily charge a portable electronic device in a place where an external power is hardly supplied, like situations where the user is going out or traveling, the user should carry an auxiliary battery inconveniently.

DISCLOSURE

Technical Problem

The present disclosure is designed to solve the problems of the related art, and therefore the present disclosure is directed to providing a data cable device, which effectively improves the ease of use of an electronic device.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided a data cable device, comprising:

USB connectors respectively formed at both opposing of the data cable device and each configured to be electrically connected to an electronic device or a battery charging adaptor;

at least one data line having one end electrically connected to one of the USB connectors and another end electrically connected to another one of the USB connectors so that a plurality of electronic devices are configured to exchange electric signals with each other;

a protection circuit module having a printed circuit board at which an external terminal electrically connected to a first one of the USB connectors is formed;

a cable battery including an external input/output terminal electrically connected to an internal terminal of the printed circuit board, an inner electrode layer having a cylindrical shape extending in one direction and formed at an inner center of the cable battery, a separator layer formed at an outer side of the inner electrode layer, an outer electrode layer formed at an outer side of the separator layer, and an inner insulation coating layer surrounding an outer surface of the outer electrode layer; and an outer insulation coating layer formed to surround at least a portion of an outer surface of the cable battery.

Also, the at least one data line may be interposed between the inner insulation coating layer and the outer insulation coating layer.

Further, the at least one data line may be located at an inner center of the inner electrode layer.

In addition, the printed circuit board may be a flexible printed circuit board, and the flexible printed circuit board may be interposed between the inner insulation coating layer and the outer insulation coating layer.

Also, at least one LED lens may be mounted to the flexible printed circuit board, and the at least one LED lens may be exposed out through a portion opened in the outer insulation coating layer.

Further, at least one of the USB connectors may include a connection terminal at which a plurality of connection pins are formed, and a housing having an opening connected to the connection terminal and having a predetermined inner space formed therein.

In addition, the printed circuit board may be included in the housing.

Moreover, at least one of the USB connectors may be spaced apart from the cable battery by a predetermined distance, and a flexible member having a hollow structure may be included in a spaced area defined by the predetermined distance between the USB connector and the cable battery.

Also, a linear protrusion protruding outward may be formed on an outer surface of the outer insulation coating layer to extend in a direction along which the outer insulation coating layer extends.

Further, the protection circuit module may include a microprocessor unit configured to control a power supplied to the first USB connector to be at least partially supplied to the cable battery so that the cable battery is charged or to control a power output from the cable battery to be supplied to the first USB connector.

In addition, the microprocessor unit may be configured so that a part of power supplied from the outside to one of the USB connectors is supplied to an electronic device when the electronic device is connected to another one of the first USB connectors and needs to be charged, and another part of the power supplied from the outside is supplied to the external input/output terminal of the cable battery so that the cable battery is charged.

Further, in another aspect of the present disclosure, there is provided an electronic system, comprising the data cable device.

Also, in another aspect of the present disclosure, there is provided a cellular phone, comprising the data cable device.

Advantageous Effects

According to an embodiment of the present disclosure, since a cable battery is provided to the data cable device, it is possible to supply power to the electronic device that needs to be charged even in a situation where an external power is not supplied from an external charging device. Further, since the data cable and the cable battery are integrated, the device size may be minimized. In addition, since a flexible cable battery is applied to the data cable device, a user may accommodate the data cable device of the present disclosure in a narrow space, and it is possible to improve the ease of use when the data cable device is connected to the electronic device.

Also, according to an embodiment of the present disclosure, since the data line is formed at the inner side of the inner electrode layer of the cable battery, the empty space at the center of the inner electrode layer of the cable battery may be utilized, and thus the inner space of the data cable device may be effectively utilized. In addition, since the data line supports the inner surface of the inner electrode layer in the outward direction, the data line may play a role of preventing the inner electrode layer from being deformed or detached, thereby increasing the durability of the cable battery.

Moreover, according to an embodiment of the present disclosure, since the data line embedded in the device is located at the outer side of the cable battery, the data line may be less affected by the heat generated from the cable battery, compared to the case where the data line is located inside the cable battery. Accordingly, it is possible to prevent the data line from being degraded or deformed due to heat, thereby preventing the components of the data line from being damaged.

In addition, according to an embodiment of the present disclosure, since the data cable device includes a flexible member disposed between the cable battery and the USB connector, it is possible to effectively reduce the occurrence of short generated at the built-in cable battery due to frequent bending between the USB connector and the cable battery.

Further, according to an embodiment of the present disclosure, since a plurality of linear protrusions are formed on the outer insulation coating layer of the data cable device, it is possible to widen the area of the outer surface of the outer insulation coating layer, thereby quickly rapidly dissipating the heat generated from the cable battery to the outside. In addition, if the linear protrusion is made of an elastic material, the linear protrusion firstly comes into contact with an external object before the internal components of the data cable are directly impacted by the external object, thereby reducing damage to the internal components.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Figure 1:
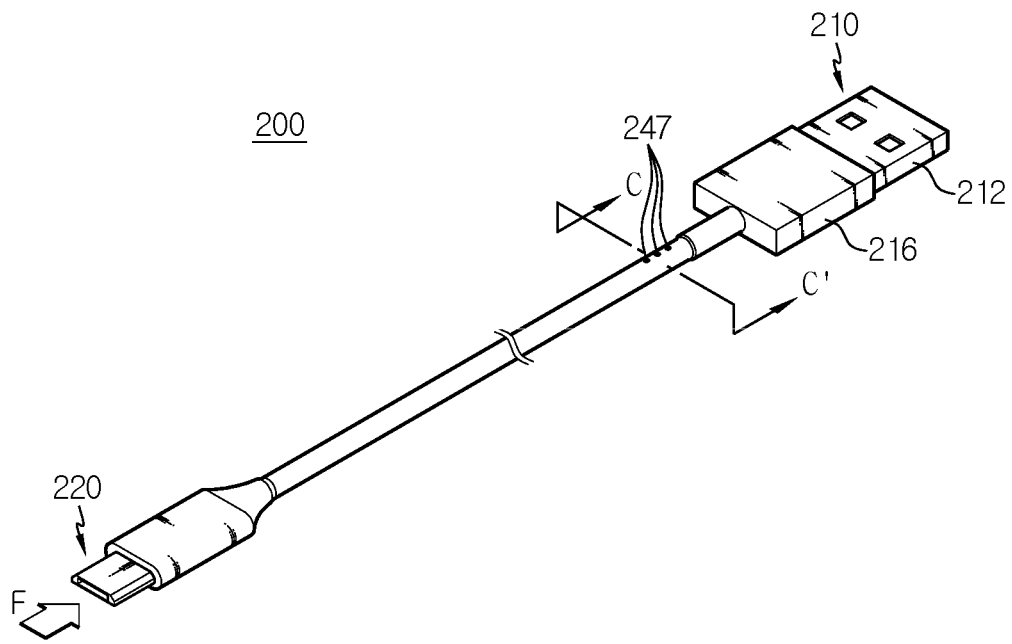
FIG. 1 is a perspective view schematically showing a data cable device according to an embodiment of the present disclosure.

FIG. 1 is a perspective view schematically showing a data cable device according to an embodiment of the present disclosure. Also, FIG. 2 is a cross-sectioned view schematically showing a section portion of the data cable device, taken along the line C-C' of FIG. 1.

Figure 2:
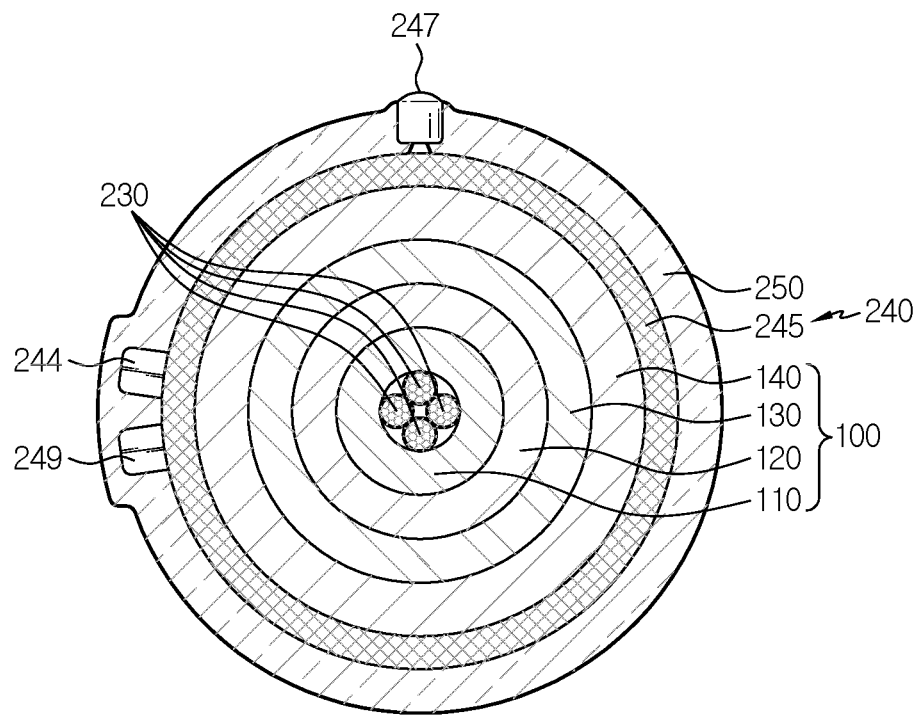
FIG. 2 is a cross-sectioned view schematically showing a section portion of the data cable device, taken along the line C-C' of FIG. 1.

Referring to FIGS. 1 and 2, a data cable device 200 of the present disclosure may include a USB connector 210, a protection circuit module 240, a cable battery 100, and an outer insulation coating layer 250.

Specifically, the data cable device 200 may include two USB connectors 210, 220 formed at both ends of the data cable device 200. That is, one USB connector 210 may be formed at one end of the data cable device 200, and the other USB connector 220 may be formed at the other end of the data cable device 200. In addition, the USB connector 210 may be configured to be electrically connected to an electronic device (not shown) or a battery charging adapter (not shown) at which a USB accommodation terminal is formed.

For example, as shown in FIG. 1, when viewed in the F direction, the data cable device 200 may include a USB connector 210 located at the rear and a USB connector 220 located at the front. In addition, the USB connector 210 and the USB connector 220 are connected to each other by a data cable.

Here, the terms indicating directions such as front, rear, left, right, upper and lower directions used herein may be changed depending on the position of an observer or the shape of an object. For the sake of convenience of description, in the present specification, directions are classified into front, rear, left, right, upper and lower directions, based on the F direction.

Here, the electronic device may be, for example, a desktop computer, a notebook computer, a smartphone, a television, an auxiliary battery charger, a portable speaker, or a music player. However, the present invention is not limited to the above examples, and any electronic device having a USB accommodation terminal into which the USB connector (USB port) 210 is inserted and connected may be applied as the electronic device.

In addition, the USB connector 210 may be an A-type, B-type or C-type USB connector 210. Here, the A-type USB connector 210 may include four connection pins 214a. Among them, two connection pins may be used for data communication, one connection pin may be used for power supply, and the other one connection pin may be used for grounding. However, the USB connector 210 is not limited to these types, and all USB types known in the art at present are applicable. In addition, the other USB connector 220 may be the same type as the USB connector 210 or may have a different type or size from the USB connector 210.

Also, the data cable device 200 may include at least one data line 230 configured to allow a plurality of electronic devices to exchange electric signals with each other.

In detail, the data line 230 may have one end electrically connected to one USB connector 210 and the other end electrically connected to the other USB connector 220. That is, the two USB connectors 210 and 220 may transmit electric signals through the data line 230, and accordingly, the plurality of electronic devices respectively connected to the two USB connectors 210 and 220 may exchange electric signals with each other.

The USB connector 210 may include a connection terminal 214 comprising a plurality of connection pins 214a and a connection plate 214b into which the connection pins 214a are inserted, and a connection tube 212 (FIG. 1) which is a rectangular tubular plate surrounding the connection plate 214b.

Moreover, the data cable device 200 may include a protection circuit module 240 having a printed circuit board 245. Specifically, the printed circuit board 245 may be formed so that a circuit allowing electric connection is printed on an electrically insulating board.

In addition, the USB connector 210 may include a housing 216 in which an opening (not shown) connected to the connection terminal 214 is formed and a predetermined inner space is formed.

In addition, the printed circuit board 245 may have an external terminal 245b electrically connected to the USB connector 210. Further, the printed circuit board 245 may have an internal terminal 245a formed to be electrically connected to the cable battery 100.

Also, the printed circuit board 245 may further include a sense resistor, a charging/discharging control switch, a fuse 249, a FET element, a microprocessor unit 244, or the like.

Referring to FIG. 2 and FIG. 3 again, the cable battery 100 may include an external input/output terminal 190, an inner electrode layer 110, a separator layer 120, an outer electrode layer 130, and an inner insulation coating layer 140.

Specifically, the external input/output terminal 190 of the cable battery 100 may include an electrically conductive material. Also, the external input/output terminal 190 may be formed to partially protrude out from the cable battery 100.

In addition, the external input/output terminal 190 may be located to contact the inner electrode layer 110 and the outer electrode layer 130, respectively. Further, the external input/output terminal 190 may be configured to be electrically connected to the internal terminal 245a of the printed circuit board 245.

For example, the external input/output terminal 190 may include a copper or aluminum material. Also, the external input/output terminal 190 may be electrically connected to the internal terminal 245a of the printed circuit board 245 using an electric wire 191.

In addition, the inner electrode layer 110 may have a cylindrical shape with a hollow structure extending in one direction or a cylindrical shape filled with an electrode material. Also, the inner electrode layer 110 may be formed at an inner center of the cable battery 100. Further, the inner electrode layer 110 may have a form in which electrode active materials having a tubular cross section are aggregated. At this time, the inner electrode layer 110 may include an electrode current collector (not shown) formed at an inner side or an inside of the hollow structure.

In addition, the electrode current collector may be in the form of an elongated wire, a mesh or a tubular sheet. Further, an electrode active material may be coated on the surface of the electrode current collector.

For example, as shown in FIG. 2, the inner electrode layer 110 may have a form in which tubular electrode active materials having a hollow are aggregated. At this time, the electrode current collector may have a wire shape. For example, the electrode active material of the inner electrode layer 110 may be a negative electrode active material.

In addition, the separator layer 120 may be formed to surround the outer surface of the inner electrode layer 110. The separator layer 120 may include a separator including an electrolyte serving as an ion transfer path and an insulating material and having a sheet form through which ions passes.

Further, the outer electrode layer 130 may include an electrode active material having a polarity opposite to that of the inner electrode layer 110. In addition, the outer electrode layer 130 may be formed to surround the outer surface of the separator layer 120. Further, the outer electrode layer 130 may have a form in which electrode active materials having a tubular cross section are aggregated. At this time, the outer electrode layer 130 may include an electrode current collector (not shown) formed at the inner side of the hollow structure.

In addition, the electrode current collector may be in the form of an elongated wire, a mesh or a tubular sheet. Further, an electrode active material may be coated on the surface of the electrode current collector.

For example, as shown in FIG. 2, the outer electrode layer 130 may have a form in which tubular electrode active materials having a hollow are aggregated. At this time, the electrode current collector may have a wire shape. For example, the electrode active material of the outer electrode layer 130 may be a positive electrode active material.

In addition, the electrode current collector plays a role of collecting electrons generated by the electrochemical reaction of the electrode active material or supplying electrons required for the electrochemical reaction. Generally, a metal such as copper or aluminum is used for the electrode current collector.

Further, the inner insulation coating layer 140 may be formed to surround the outer surface of the outer electrode layer 130. Specifically, the inner insulation coating layer 140 may include an electrically insulating material. For example, the inner insulation coating layer 140 may include a polyvinyl chloride (PVC) material.

Thus, according to this configuration of the present disclosure, since the data cable device 200 includes the cable battery 100, it is possible to supply power to an electronic device requiring charging even in a situation where an external power cannot be supplied from an external charging device.

Further, since the data cable and the cable battery 100 are integrated, the device size may be minimized. Moreover, since the data cable device 200 includes a flexible cable battery 100, a user may accommodate the data cable device 200 of the present disclosure in a narrow space, and the data cable device 200 may be connected to an electronic device more conveniently.

In addition, the outer insulation coating layer 250 may be formed to surround at least a portion of the outer surface of the cable battery 100. Specifically, the outer insulation coating layer 250 may include a sheath having an electrically insulating material.

For example, the sheath may include a polyvinyl chloride (PVC) material. A braided shield (not shown) or a spiral shield plated with tin may be located at an inner side of the sheath. In addition, a polyester inner shield (not shown) plated with aluminum may be located at an inner side of the braided shield. Accordingly, the cable battery 100 and the data line 230 included in the sheath may be protected from an external shock, and an external electromagnetic wave may be blocked to reduce noise generation in data communication.

In addition, the printed circuit board 245 may be a flexible printed circuit board (FPCB). Here, the flexible printed circuit board 245 may be formed by, for example, printing a circuit allowing electric connection to a substrate made of an electrically insulating and flexible material. For example, the flexible material may be polyimide. However, the present invention is not necessarily limited to such a material, and any substrate material available for the flexible printed circuit board may be applied.

Further, the flexible printed circuit board 245 may be interposed between the inner insulation coating layer 140 and the outer insulation coating layer 250. In addition, the flexible printed circuit board 245 may be extended to connect the USB connector 210 formed at one end of the data cable device 200 and the other USB connector 220 formed at the other end of the data cable device 200.

Alternatively, the flexible printed circuit board 245 may be connected to any one of the USB connectors 210, 220 formed at both ends of the data cable device 200 and extend toward the remaining USB connector to which the flexible printed circuit board 245 is not connected. Further, the flexible printed circuit board 245 may be located at one side where any one of the USB connectors 210, 220 at both ends is located with respect to the center of the data cable device 200.

Figure 3:
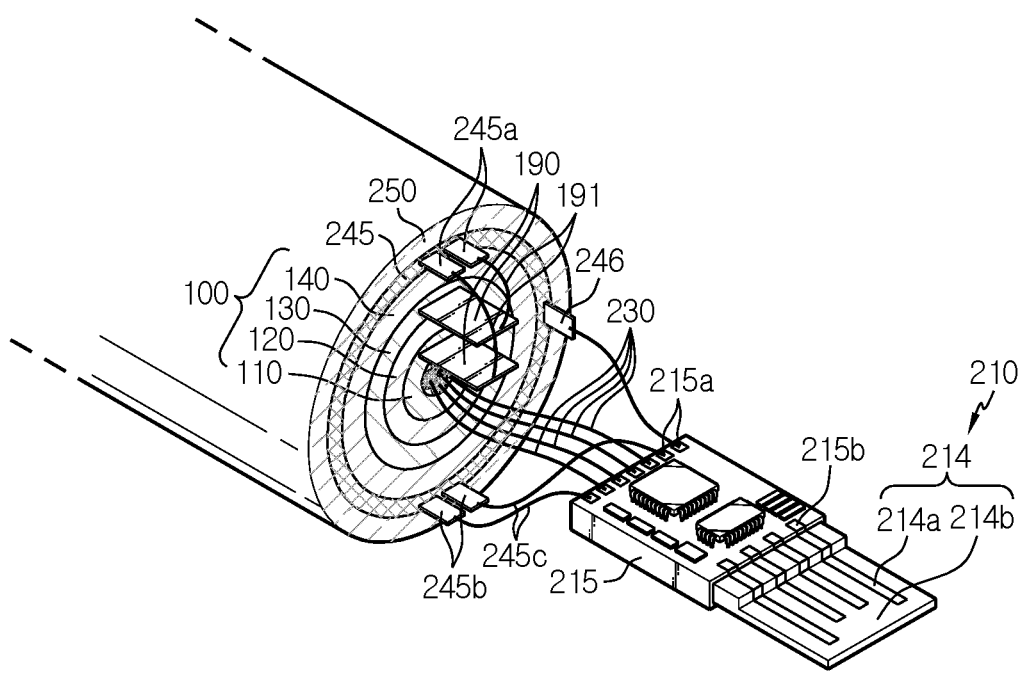
FIG. 3 is a partially exploded perspective view schematically showing some components of the data cable device according to an embodiment of the present disclosure.

For example, as shown in FIG. 3, the flexible printed circuit board 245 may be located at one side in a longitudinal direction along which the cable is extended, with respect to the center of the data cable device 200 so as to be electrically connected to the USB connector 210 formed at one end of the data cable device 200. At this time, the flexible printed circuit board 245 may be interposed between the inner insulation coating layer 140 and the outer insulation coating layer 250.

In addition, at least one LED lens 247 may be mounted to the flexible printed circuit board 245. Specifically, the LED lens 247 may be configured to be partially exposed out through a portion opened in the outer insulation coating layer 250. Moreover, the LED lens 247 can be configured to indicate the state of charge of the battery.

For example, as shown in FIG. 1, the flexible printed circuit board 245 may include three LED lenses 247. Also, the flexible printed circuit board 245 may be configured such that, for example, three of the three LED lenses 247 are turned on when the cable battery 100 is charged to 70% or above up to 100%. Further, the flexible printed circuit board 245 may be configured such that two of the three LED lenses 247 are turned on when the cable battery 100 is charged to 30% or more and less than 70%. In addition, the flexible printed circuit board 245 may be configured such that one of the three LED lenses 247 is turned on when the cable battery 100 is charged to less than 30%.

Meanwhile, referring to FIGS. 1 and 2 again, the data line 230 may be located at an inner center further to the inner electrode layer 110. That is, the data line 230 may be located in an empty space formed inside the inner electrode layer 110. Since the electromagnetic wave of the cable battery 100 may affect (disturb) the data line 230 at the inside of the inner electrode layer 110, a shield layer (not shown) may be further formed to reduce the disturbance. For example, the inner side of the shield layer may be a polyester shield plated with aluminum.

For example, as shown in FIG. 2, four data lines 230 may be located in the empty space formed inside the inner electrode layer 110. In addition, the four data lines 230 may be formed to support the inner surface of the inner electrode layer 110 in the outward direction.

Thus, according to this configuration of the present disclosure, since the data lines 230 are formed inside the inner electrode layer 110, the empty space at the center of the inner electrode layer 110 of the cable battery 100 may be utilized, thereby increasing the utilization of the inner space of the data cable device 200. In addition, the data line 230 may serve to prevent the inner electrode layer 110 from being deformed or detached by supporting the inner surface of the inner electrode layer 110 in the outward direction, thereby increasing durability of the cable battery 100.

In addition, FIG. 3 is a partially exploded perspective view schematically showing some components of the data cable device according to an embodiment of the present disclosure. For reference, FIG. 3 depicts a state where the housing 216 and the connection tube 212 are separated and removed from the USB connector 210 of FIG. 1.

Referring to FIGS. 1 and 3, an external terminal 245b may be formed at one end of the flexible printed circuit board 245. Moreover, the external terminal 245b may be electrically connected to another printed circuit board 215 that is electrically connected to the connection pin 214a of the USB connector 210.

Also, the other printed circuit board 215 may have a circuit (not shown) or a connection terminal 215a to supply the power supplied from the USB connector 210 to the cable battery 100 or to supply the power output from the cable battery 100 to the USB connector 210.

In addition, an internal terminal 245a may be formed at one end of the flexible printed circuit board 245. Further, the internal terminal 245a may be configured to be electrically connected to the external input/output terminal 190 formed at one end of the cable battery 100.

For example, as shown in FIG. 3, the flexible printed circuit board 245 may be interposed between the inner insulation coating layer 140 and the outer insulation coating layer 250. Also, two external terminals 245b may be formed at one end of the flexible printed circuit board 245. Further, the two external terminals 245b may be connected through the input terminal 215b, the connection terminal 215a and the electric wire 245c of another printed circuit board 215 that is electrically connected with the connection pin 214a of the USB connector 210.

Moreover, a signal terminal 246 configured to transmit a control signal to another printed circuit board 215 may be further formed at one end of the flexible printed circuit board 245. That is, the flexible printed circuit board 245 is configured to exchange control signals with another printed circuit board 215 through the signal terminal 246.

In addition, as shown in FIG. 3, the flexible printed circuit board 245 may have two internal terminals 245a electrically connected to two external input/output terminals 190 respectively connected to the inner electrode layer 110 and the outer electrode layer 130 at one end via the electric wire 191. Also, the four data lines 230 may be electrically connected to another printed circuit board 215.

Figure 4:
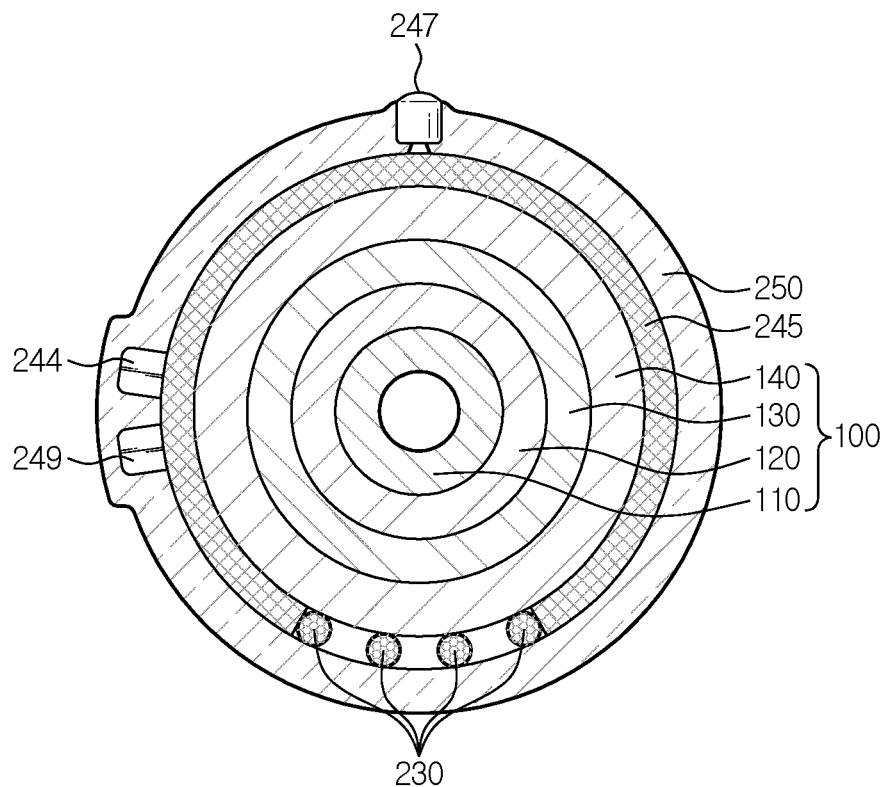
FIG. 4 is a sectioned view schematically showing a lateral section portion of the data cable device according to another embodiment of the present disclosure.

FIG. 4 is a sectioned view schematically showing a lateral section portion of the data cable device according to another embodiment of the present disclosure.

Referring to FIG. 4, in the data cable device 200A according to another embodiment of the present disclosure, the data line 230 may be interposed between the inner insulation coating layer 140 and the outer insulation coating layer 250.

Specifically, the data line 230 may be located at a portion where the flexible printed circuit board 245 located between the inner insulation coating layer 140 and the outer insulation coating layer 250 is not formed. That is, the flexible printed circuit board 245 may be formed not to occupy the entire space between the inner insulation coating layer 140 and the outer insulation coating layer 250 but to occupy only a part of the space.

For example, as shown in FIG. 4, four data lines 230 may be interposed between the inner insulation coating layer 140 and the outer insulation coating layer 250.

Thus, according to this configuration of the present disclosure, since the data line 230 is located at the outer side of the cable battery 100, the data line 230 may be less affected by the heat generated from the cable battery 100, compared to the case where the data line 230 is located at the inner side of the cable battery 100. Accordingly, the data line 230 may be prevented from degrading durability or deforming due to heat, and also it is possible to prevent the components of the data line 230 from being damaged.

Figure 5:
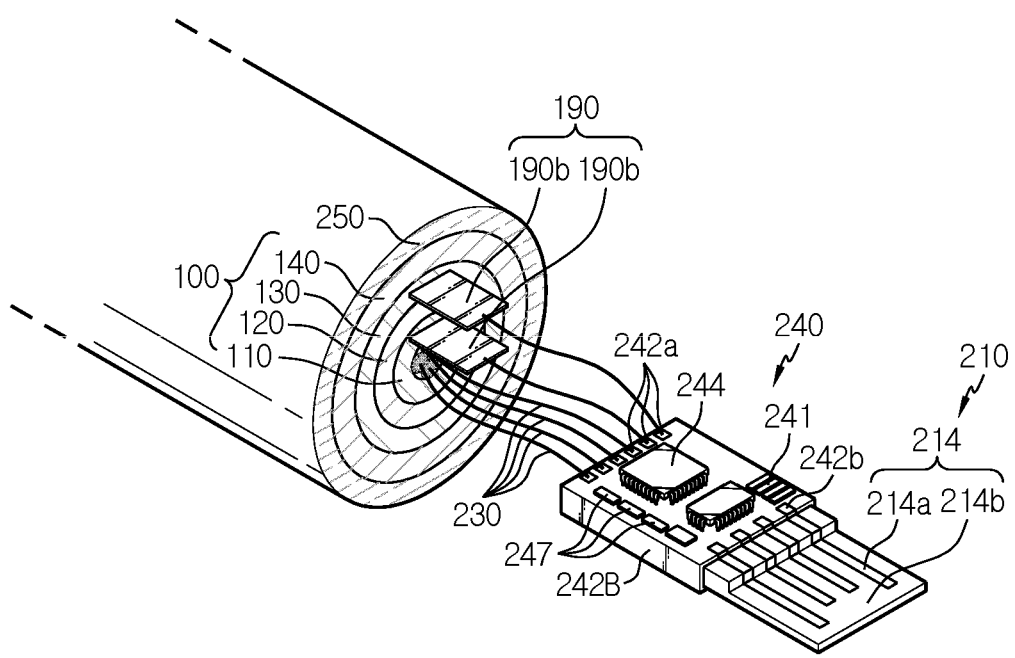
FIG. 5 is a partially exploded perspective view schematically showing some components of a data cable device according to another embodiment of the present disclosure.

FIG. 5 is a partially exploded perspective view schematically showing some components of a data cable device according to another embodiment of the present disclosure.

Referring to FIGS. 1 and 5, the printed circuit board 242B of the data cable device according to another embodiment of the present disclosure may be embedded in the housing 216. In addition, the printed circuit board 242B may be a hard printed circuit board 242B.

Moreover, a microprocessor unit 244 may be mounted to the printed circuit board 242B. Specifically, the microprocessor unit 244 is configured such that at least a part of the power supplied to the USB connector 210 is supplied to the cable battery 100 so that the cable battery 100 is charged, or configured to control the power output from the cable battery 100 to be supplied to the USB connector 210.

In addition, the microprocessor unit 244 may be configured to discharge the cable battery 100 to supply power to the USB connector 210 when an electronic device requiring charging is connected to the USB connector 210. For example, at this time, the microprocessor unit 244 may control the charging/discharging control switch (not shown) to be turned on.

Further, the microprocessor unit 244 may control such that a part of the power supplied from the outside to the USB connector 210 formed at one end of the data cable device 200 is supplied to the electronic device that needs to be charged and is connected to the USB connector 220 formed at the other end. At the same time, the microprocessor unit 244 may control such that the other part of the power remaining after being supplied to the electronic device is supplied to the external input/output terminal 190 toward the cable battery 100 so that the cable battery 100 is charged.

At this time, for example, the microprocessor unit 244 may turn on the control switch for supplying power to the other USB connector 220 and the charging/discharging control switch of the cable battery 100 so that power is supplied to both a power line for supplying power to the other USB connector 210 and a power line for supplying power to the cable battery 100.

In addition, an external terminal 242b electrically connected to the connection pin 214a of the connection terminal 214 may be formed at the hard printed circuit board 242B. Also, the hard printed circuit board 242B may have an internal terminal 242a electrically connected to the external input/output terminal 190 of the cable battery 100 via the electric wire 191. Further, the internal terminal 242a may also be electrically connected to the data line 230.

Moreover, the hard printed circuit board 242B may further include a memory element 241.

Figure 6:
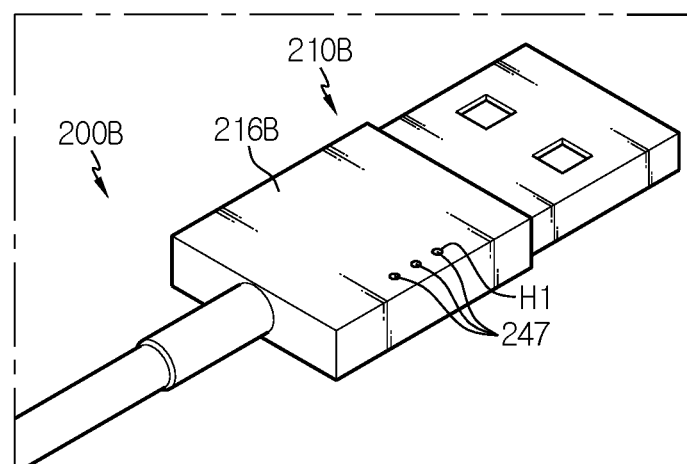
FIG. 6 is a perspective view schematically showing a portion of the data cable device according to another embodiment of the present disclosure.

FIG. 6 is a perspective view schematically showing a portion of the data cable device according to another embodiment of the present disclosure.

Referring to FIG. 6 along with FIG. 5, the hard printed circuit board 242B may include at least one LED lens 247 at an upper portion thereof. Also, the LED lens 247 provided at the upper portion may be configured to be exposed out through a perforation hole H1 formed from the inside of the housing 216B of the USB connector 210B to the outside. That is, the perforation hole H1 may be formed in the housing 216B of the USB connector 210B at a position corresponding to the LED lens 247.

For example, referring to FIG. 5, three LED lenses 247 may be formed at the upper portion of the hard printed circuit board 242B. Also, referring to FIG. 6, the three LED lenses may be formed to be exposed out through the perforation hole H1 formed in the housing 216B of the USB connector 210B.

Figure 7:
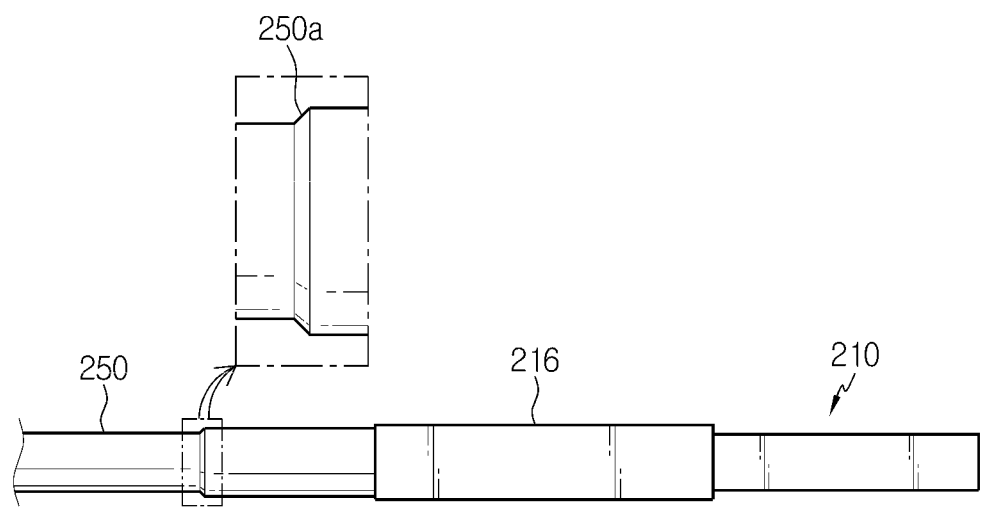
FIGS. 7 and 8 are perspective views schematically showing a portion of the data cable device according to an embodiment of the present disclosure.
Figure 8:
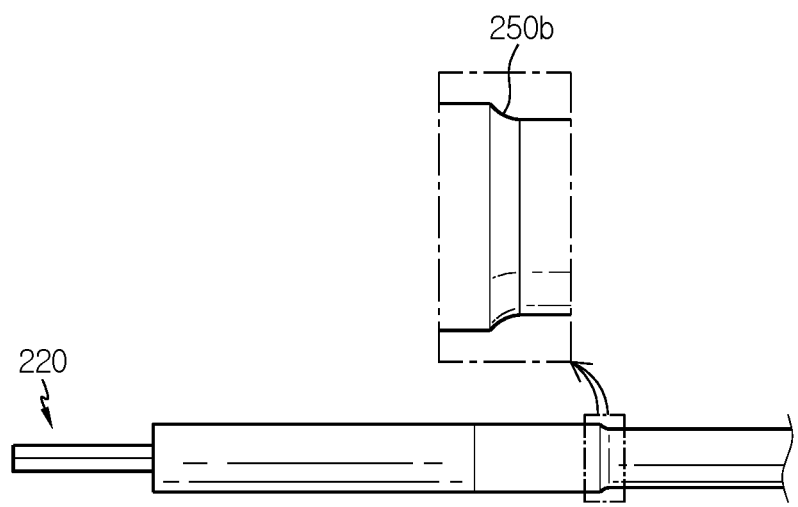

FIGS. 7 and 8 are perspective views schematically showing a portion of the data cable device according to an embodiment of the present disclosure.

Referring to FIGS. 7 and 8 along with FIG. 1, a chamfer structure 250a may be formed at the outer insulation coating layer 250 adjacent to the USB connector 210 of the data cable device 200. In addition, a round structure 250b may be formed at the outer insulation coating layer 250 adjacent to the other USB connector 220 of the data cable device 200.

Specifically, a portion of the outer insulation coating layer 250 in contact with the housing 216 of the USB connector 210 and a portion of the outer insulation coating layer 250 near the center of the data cable device 200 in the longitudinal direction may have different diameters from each other. In addition, the chamfer structure 250a or the round structure 250b may be formed at a connection portion of two portions of the outer insulation coating layer 250 with different diameters.

For example, as shown in FIG. 7, the chamfer structure 250a may be formed at a connection portion of two portions of the outer insulation coating layer 250 with different diameters. Also, as shown in FIG. 8, the round structure 250b may be formed at a connection portion of two portions of the outer insulation coating layer 250 with different diameters.

Thus, according to this configuration of the present disclosure, since portions having different diameters are formed at the outer insulation coating layer 250 and the chamfer structure 250a or the round structure 250b is formed at the portion connecting the two portions, it is possible to prevent the built-in cable battery 100 from being shorted or the data line 230 from being disconnected due to frequent bending of the cable. That is, the chamfer structure 250a and the round structure 250b have an effect of dispersing a stress to a wider range so that the stress caused by the bending of the cable is not concentrated on the built-in cable battery 100 or the data line 230.

Figure 9:
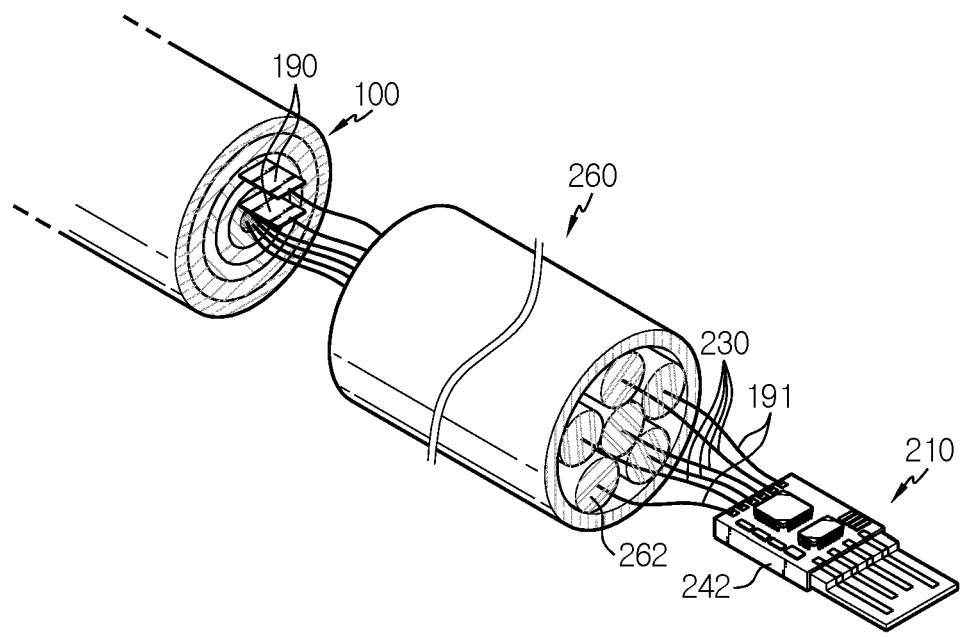
FIG. 9 is a partially exploded perspective view schematically showing some components of a data cable device according to still another embodiment of the present disclosure.

FIG. 9 is a partially exploded perspective view schematically showing some components of a data cable device according to still another embodiment of the present disclosure. FIG. 9 depicts a state where the outer insulation coating layer 250 of a flexible member 260 and the housing 216 of the USB connector 210 are omitted in order to show the inner configuration of the data cable device 200 according to the present disclosure.

Referring to FIG. 9, the USB connector 210 and the cable battery 100 may be arranged to be spaced apart by a predetermined distance. In addition, in the spaced area between the USB connector 210 and the cable battery 100, the flexible member 260 may be included in the outer insulation coating layer 250.

Moreover, the flexible member 260 may have a hollow structure in which the inside thereof is perforated in the front and rear direction. In addition, the hollow structure of the flexible member 260 may include an electrically insulating coating material 262 configured to surround the outer surface of the data line 230 and the electric wire 191. Specifically, the coating material 262 may have a relatively larger diameter than the data line 230 and the electric wire 191. Further, the coating material 262 may be located inside the hollow structure of the flexible member 260 and may be configured to support the flexible member 260 outward. The flexible member 260 may have a rubber or silicone material.

Moreover, the data line 230 and the electric wire 191 electrically connected to the external input/output terminal 190 of the cable battery 100 may be configured to be in contact with the coating material 262 of the flexible member 260. That is, the USB connector 210 may be electrically connected to the cable battery 100 and the other USB connector 220 through the data line 230 and the electric wire 191.

For example, as shown in FIG. 9, one flexible member 260 may be added between the USB connector 210 and the cable battery 100. At this time, the flexible member 260 may have a hollow structure perforated in the front and rear direction, and four data lines 230 and two electric wires 191 along with six coating materials 262 formed to surround the four data lines 230 and two electric wires 191 may be added inside the hollow structure.

Thus, according to this configuration of the present disclosure, since the data cable device 200 includes the flexible member 260 disposed between the cable battery 100 and the USB connector 210, it is possible to prevent the built-in cable battery 100 from being shorted or the data line 230 from being disconnected due to frequent bending generated between the USB connector 210 and the cable battery 100.

That is, since the flexible member 260 is added to a portion where bending occurs frequently, it is possible to effectively reduce that a stress caused by the bending of the data cable is directly transferred to the built-in cable battery 100 or the data line 230.

Figure 10:
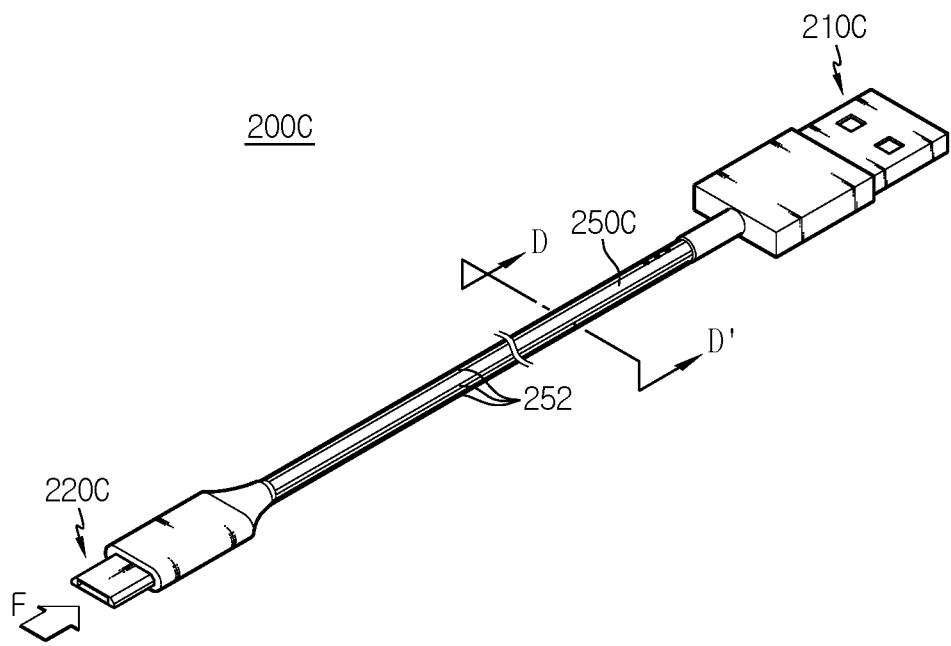
FIG. 10 is a perspective view schematically showing some components of a data cable device according to still another embodiment of the present disclosure.

FIG. 10 is a perspective view schematically showing some components of a data cable device according to still another embodiment of the present disclosure. Also, FIG. 11 is a cross-sectioned view schematically showing a section portion of the data cable device, taken along the line D-D' of FIG. 10.

Figure 11:
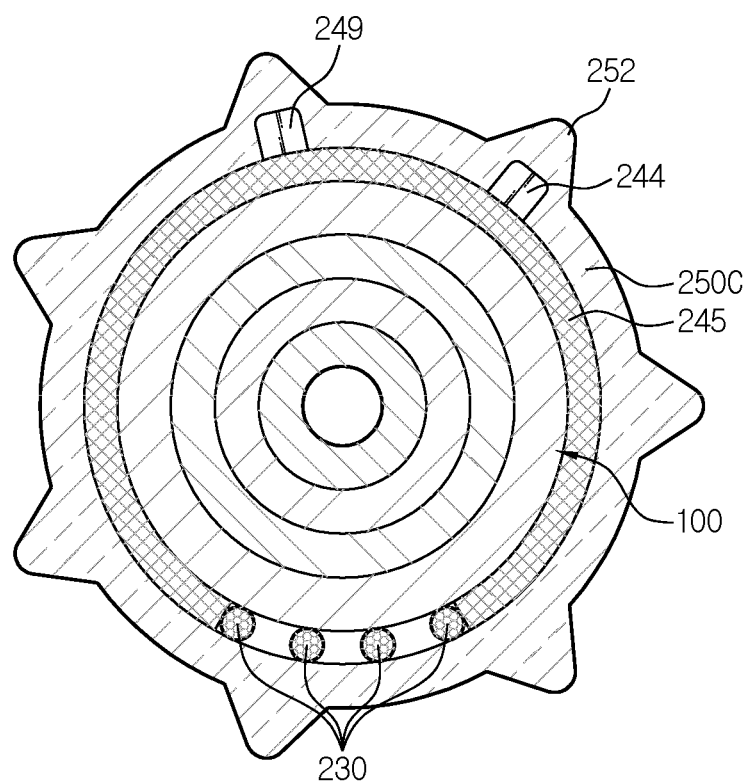
FIG. 11 is a cross-sectioned view schematically showing a section portion of the data cable device, taken along the line D-D' of FIG. 10.

Referring to FIGS. 10 and 11, a linear protrusion 252 protruding outward may be formed on the outer surface of the outer insulation coating layer 250C. Specifically, when viewed in the F direction, the linear protrusion 252 may be formed to extend in the longitudinal direction (in the front and rear direction) along the outer insulation coating layer 250C. That is, the linear protrusion 252 may extend toward the USB connectors 210C, 220C formed at both ends.

For example, as shown in FIG. 11, seven linear protrusions 252 may be formed on the outer surface of the outer insulation coating layer 250C. Also, as shown in FIG. 10, the seven linear protrusions may extend in the longitudinal direction along the outer insulation coating layer 250C of the data cable device 200C.

Moreover, elements 249, 244 of the printed circuit board 245 may be located inside the linear protrusion 252. The elements may be, for example, a sense resistor, a charging/discharging control switch, a fuse 249, a FET element, a microprocessor unit 244, or the like. That is, the linear protrusion 252 may be formed to surround the elements of the printed circuit board 245. In addition, the plurality of elements may be arranged in a line along the linear protrusion 252 extending in the front and rear direction and may be located inside the linear protrusion 252.

Thus, according to this configuration of the present disclosure, since the plurality of linear protrusions 252 are formed on the outer insulation coating layer 250C of the data cable device 200C, the area of the outer surface of the outer insulation coating layer 250C may be further increased, thereby quickly dissipating the heat generated from the cable battery 100 to the outside. Moreover, the linear protrusions 252 are made of an elastic material, the linear protrusion 252 comes into contact with an external object before the internal components 245, 100, 230 of the data cable device are directly impacted by the external object, thereby reducing damage to the internal components such as the fuse and the switch.

Also, an electronic system according to the present disclosure may include the data cable device 200. For example, the electronic system may further include the battery charging adapter. That is, the electronic system may include the data cable device 200 for charging or discharging a battery included in the electronic device or for performing data communication between the electronic device and another electronic device.

In addition, a cellular phone according to the present disclosure may include the data cable device 200. For example, the cellular phone may further include a communication module for wirelessly communicating with an external device.

Meanwhile, even though the terms indicating directions such as upper, lower, left, right, front and rear directions are used in the specification, it is obvious to those skilled in the art that these merely represent relative positions for convenience in explanation and may vary based on a position of an observer or an object.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

REFERENCE SIGNS

| | |
|---|---|
| 200: data cable device | 100: cable battery |
| 210, 220: USB connector | 230: data line |
| 190: external input/output terminal | 110: inner electrode layer |
| 120: separator layer | 130: outer electrode layer |
| 140: inner insulation coating layer | 240: protection circuit module |
| 245: printed circuit board | 250: outer insulation coating layer |
| 247: LED lens | 260: flexible member |
| 244: microprocessor unit | 252: linear protrusion |

INDUSTRIAL APPLICABILITY

The present disclosure relates to a data cable device. Also, the present disclosure is applicable to industries related to electronic systems or cellular phones, which include the data cable device.

What is claimed is:

1. A data cable device, comprising:
   USB connectors respectively formed at opposing ends of the data cable device and each configured to be electrically connected to an electronic device or a battery charging adaptor;
   at least one data line having one end electrically connected to one of the USB connectors and another end electrically connected to another one of the USB connectors so that a plurality of electronic devices are configured to exchange electric signals with each other;
   a protection circuit module having a printed circuit board at which an external terminal electrically connected to a first one of the USB connectors is formed;
   a cable battery including an external input/output terminal electrically connected to an internal terminal of the printed circuit board, an inner electrode layer having a cylindrical shape extending in one direction and formed at an inner center of the cable battery, a separator layer formed at an outer side of the inner electrode layer, an outer electrode layer formed at an outer side of the separator layer, and an inner insulation coating layer surrounding an outer surface of the outer electrode layer; and
   an outer insulation coating layer formed to surround at least a portion of an outer surface of the cable battery,
   wherein the at least one data line is located at an inner center of the inner electrode layer.

2. The data cable device according to claim 1,
   wherein at least one of the USB connectors includes a connection terminal at which a plurality of connection pins are formed, and a housing having an opening connected to the connection terminal and having a predetermined inner space formed therein, and
   wherein the printed circuit board is included in the housing.

3. The data cable device according to claim 1,
   wherein a linear protrusion protruding outward is formed on an outer surface of the outer insulation coating layer to extend in a direction along which the outer insulation coating layer extends.

4. The data cable device according to claim 1,
   wherein the protection circuit module includes a microprocessor unit configured to control a power supplied to the first USB connector to be at least partially supplied to the cable battery so that the cable battery is charged or to control a power output from the cable battery to be supplied to the first USB connector.

5. The data cable device according to claim 4,
   wherein the microprocessor unit is configured so that a part of power supplied from the outside to one of the USB connectors is supplied to an electronic device when the electronic device is connected to another one of the first USB connectors and needs to be charged, and another part of the power supplied from the outside is supplied to the external input/output terminal of the cable battery so that the cable battery is charged.

6. An electronic system, comprising the data cable device according to claim 1.

7. A cellular phone, comprising the data cable device according to claim 1.

8. A data cable device, comprising:
   USB connectors respectively formed at opposing ends of the data cable device and each configured to be electrically connected to an electronic device or a battery charging adaptor;
   at least one data line having one end electrically connected to one of the USB connectors and another end electrically connected to another one of the USB connectors so that a plurality of electronic devices are configured to exchange electric signals with each other;
   a protection circuit module having a printed circuit board at which an external terminal electrically connected to a first one of the USB connectors is formed;
   a cable battery including an external input/output terminal electrically connected to an internal terminal of the printed circuit board, an inner electrode layer having a cylindrical shape extending in one direction and formed at an inner center of the cable battery, a separator layer formed at an outer side of the inner electrode layer, an outer electrode layer formed at an outer side of the separator layer, and an inner insulation coating layer surrounding an outer surface of the outer electrode layer; and an outer insulation coating layer formed to surround at least a portion of an outer surface of the cable battery,
wherein the printed circuit board is a flexible printed circuit board, and
wherein the flexible printed circuit board is interposed between the inner insulation coating layer and the outer insulation coating layer.

9. The data cable device according to claim 8,
wherein at least one LED lens is mounted to the flexible printed circuit board, and
wherein the at least one LED lens is exposed out through a portion opened in the outer insulation coating layer.

10. A data cable device comprising:
USB connectors respectively formed at opposing ends of the data cable device and each configured to be electrically connected to an electronic device or a battery charging adaptor;
at least one data line having one end electrically connected to one of the USB connectors and another end electrically connected to another one of the USB connectors so that a plurality of electronic devices are configured to exchange electric signals with each other;
a protection circuit module having a printed circuit board at which an external terminal electrically connected to a first one of the USB connectors is formed;
a cable battery including an external input/output terminal electrically connected to an internal terminal of the printed circuit board, an inner electrode layer having a cylindrical shape extending in one direction and formed at an inner center of the cable battery, a separator layer formed at an outer side of the inner electrode layer, an outer electrode layer formed at an outer side of the separator layer, and an inner insulation coating layer surrounding an outer surface of the outer electrode layer; and
an outer insulation coating layer formed to surround at least a portion of an outer surface of the cable battery,
wherein at least one of the USB connectors is spaced apart from the cable battery by a predetermined distance, and
wherein a flexible member having a hollow structure is included within the outer insulation coating layer in a spaced area defined by the predetermined distance between the USB connector and the cable battery.

* * * * *